(12) United States Patent
Larsen et al.

(10) Patent No.: US 9,236,930 B2
(45) Date of Patent: Jan. 12, 2016

(54) METHODS AND APPARATUS FOR ANTENNA TUNING

(71) Applicant: Nokia Corporation, Espoo (FI)

(72) Inventors: Niels Bonne Larsen, Encinitas, CA (US); Kevin Li, San Diego, CA (US)

(73) Assignee: Nokia Technologies Oy, Espoo (FI)

( * ) Notice: Subject to any disclaimer, the term of this patent is extended or adjusted under 35 U.S.C. 154(b) by 148 days.

(21) Appl. No.: 13/917,047

(22) Filed: Jun. 13, 2013

(65) Prior Publication Data

US 2014/0370824 A1    Dec. 18, 2014

(51) Int. Cl.
*H04B 7/12* (2006.01)
*H04B 1/04* (2006.01)
*H04B 1/18* (2006.01)

(52) U.S. Cl.
CPC ............... *H04B 7/12* (2013.01); *H04B 1/0458* (2013.01); *H04B 1/18* (2013.01)

(58) Field of Classification Search
CPC ........ H04B 1/0053; H04B 7/12; H04W 24/00
USPC .................. 455/87, 77, 526, 120, 125, 150.1, 455/178.1, 182.3; 343/745
See application file for complete search history.

(56) References Cited

U.S. PATENT DOCUMENTS

| 3,571,723 | A | * | 3/1971 | Ogusu | 455/190.1 |
|---|---|---|---|---|---|
| 4,015,074 | A | * | 3/1977 | Inoue et al. | 725/33 |
| H001219 | H | * | 8/1993 | Miller | 343/708 |
| 8,754,817 | B1 | * | 6/2014 | Kuo et al. | 343/702 |
| 2008/0106476 | A1 | * | 5/2008 | Tran et al. | 343/702 |
| 2008/0305750 | A1 | | 12/2008 | Alon et al. | 455/77 |
| 2010/0060531 | A1 | | 3/2010 | Rappaport et al. | 343/702 |
| 2010/0120466 | A1 | | 5/2010 | Li | 455/552.1 |
| 2011/0234335 | A1 | | 9/2011 | Khlat et al. | 333/132 |
| 2012/0082046 | A1 | | 4/2012 | Ho et al. | 370/252 |
| 2013/0135162 | A1 | * | 5/2013 | Shamblin et al. | 343/745 |
| 2013/0328723 | A1 | * | 12/2013 | Rappaport | 342/372 |
| 2014/0139380 | A1 | * | 5/2014 | Ouyang et al. | 343/702 |
| 2014/0179239 | A1 | * | 6/2014 | Nickel et al. | 455/67.14 |

FOREIGN PATENT DOCUMENTS

WO    WO 03/065499 A2    8/2003
WO    WO 2007/042615 A1    4/2007

(Continued)

OTHER PUBLICATIONS

"WiSpry Demonstrates Seven-fold Extension of LTE Bandwidth in Smartphones"http://wispry.com/newsmedia_pressrelease_click.php?id=174; Publication Date: Aug. 8, 2012; (2 pages).

(Continued)

*Primary Examiner* — Minh D Dao
(74) *Attorney, Agent, or Firm* — Harrington & Smith

(57) ABSTRACT

Systems and techniques for management of an antenna tuning frequency range. Frequency coverage needed for an antenna used in a portable communications device in a wireless communication network is determined based on communication protocols being used, with an active tuner being connected to a passively tuned antenna when a different frequency range is called for and with the active tuner being effectively isolated when only the range provided by the passively tuned antenna is needed to reduce the risk of RF mixing or intermodulation.

21 Claims, 17 Drawing Sheets

(56) References Cited

FOREIGN PATENT DOCUMENTS

WO    WO-2009/155966 A1    12/2009
WO    WO 2011/051554 A1    5/2011

OTHER PUBLICATIONS

Steel, et al.: "Tunable RF Technology Overview;" WiSpry Inc.; http://www.microwavejournal.com/articles/print/18571-tunable-rf-technology-overview; Publication Date: Nov. 14, 2012; (8 pages).

Nowroozi, Bijan; "Inching Ever Closer to the Any 3G/LTE Network Mobile Device," http://www.sonlte.com/2013/01/22/inching-ever-closer-to-the-any-network-mobile-device/; Publication Date: Jan. 22, 2013 (7 pages).

* cited by examiner

METHODS AND APPARATUS FOR ANTENNA TUNING

TECHNICAL FIELD

The present invention relates generally to wireless communication. More particularly, the invention relates to improved systems and techniques for antenna tuning to select between active and passive tuning circuits.

BACKGROUND

As the popularity of wireless cellular data communications devices, and the demands made on them, continue to increase, network operators are constantly looking for ways to accommodate increasingly versatile mechanisms for communication between networks and portable communication devices, and manufacturers are constantly looking for ways to adapt their devices to use different communication mechanisms that may be provided by network operators.

SUMMARY

In one embodiment of the invention, an apparatus comprises at least one processor and memory storing computer program code. The memory storing the computer program code is configured to, with at least one processor, cause the apparatus to at least determine a frequency range to be covered by a portable communications device operating in a wireless communication network and control one or more connections between an active tuner and an antenna passively tuned to one or more specified frequency ranges, so as to select coverage of the one or more specified frequency ranges to which the antenna is passively tuned, or one or more frequency ranges that are different from the specified frequency range by the antenna in combination with the active tuner.

In another embodiment of the invention, a method comprises determining a frequency range to be covered by a portable communications device operating in a wireless communication network and controlling one or more connections between an active tuner and an antenna passively tuned to one or more specified frequency ranges, so as to select coverage of the one or more specified frequency ranges to which the antenna is passively tuned, or one or more frequency ranges that are different from the specified frequency range by the antenna in combination with the active tuner.

In another embodiment of the invention, a computer readable medium stores a program of instructions. Execution of the program of instructions by a processor configures an apparatus to at least determine a frequency range to be covered by a portable communications device operating in a wireless communication network and control one or more connections between an active tuner and an antenna passively tuned to one or more specified frequency ranges, so as to select coverage of the one or more specified frequency ranges to which the antenna is passively tuned, or one or more frequency ranges that are different from the specified frequency range by the antenna in combination with the active tuner.

DETAILED DESCRIPTION

Figure 1:
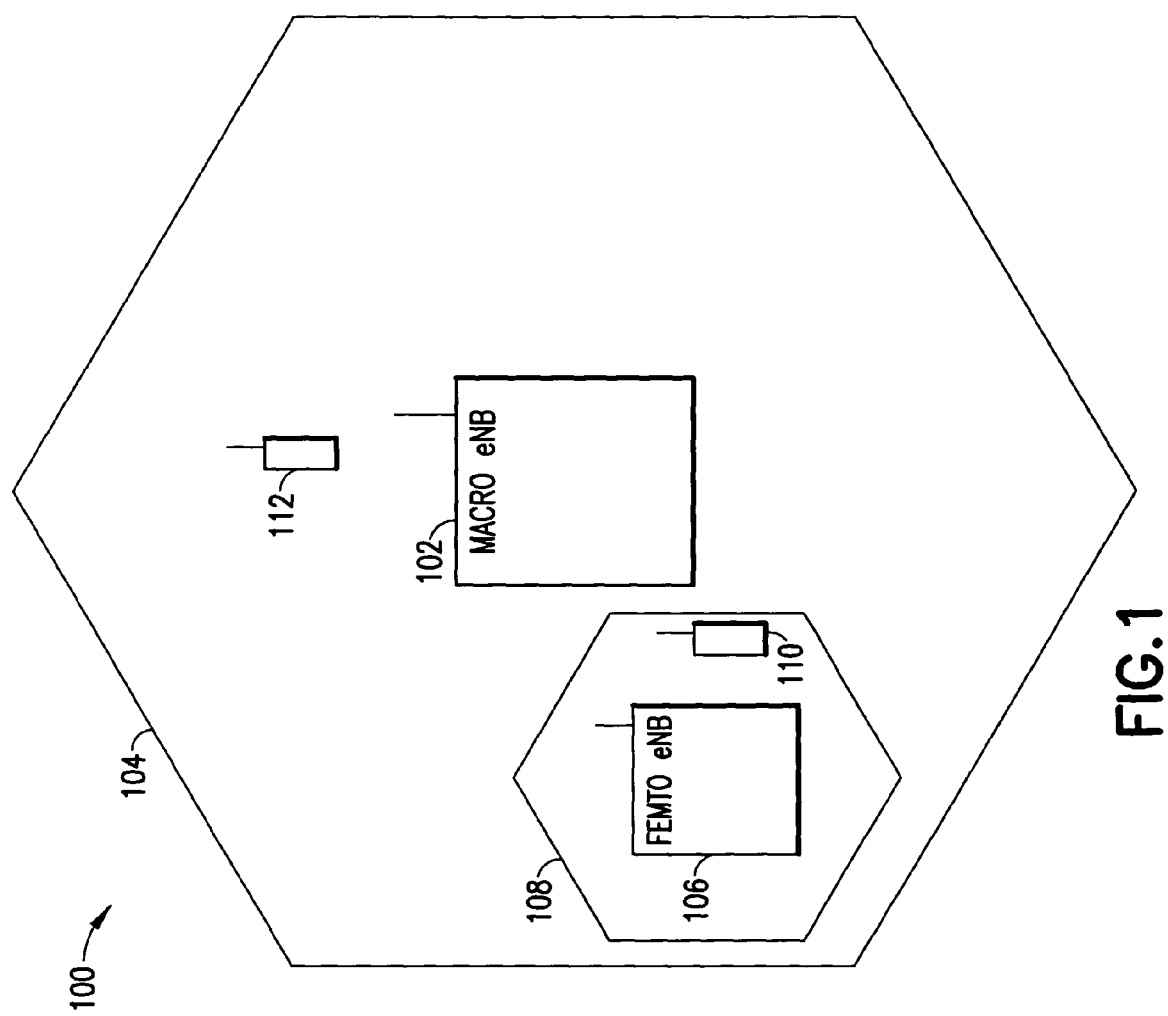
FIG. 1 illustrates a wireless communication network according to an embodiment of the present invention.

Embodiments of the present invention recognize that wireless communication frequencies are being used to communicate data between numerous devices of widely differing configurations, and that such devices are being put to a wide variety of uses. One popular use for portable electronic devices, such as wireless devices or portable communications devices, is the transmission and reception of video data, and devices are being developed with larger screens than in previous years. Many tablet computers, for example, have been developed with wireless cellular capability, and smaller portable electronic devices, still called "phones" have tended to be larger in size as the desire for larger video displays has overcome the trend toward miniaturization that previously prevailed. Even many smaller devices tend to be designed so as to accommodate a relatively large screen size, and the relatively large screen size, together with the desire of users to send and receive high resolution video on their devices, imposes requirements for relatively high data rates on networks and devices. One way in which network operators achieve the high data rates desired by users is to use uplink and downlink carrier aggregation, in which a portable communications device communicates using two frequencies in different frequency bands or two frequencies within a single band. For example, a device may use a first frequency to communicate with a primary cell base station and a second frequency to communicate with a secondary cell base station. In another example, a device may use first and second frequencies to communicate with a single base station. To take another example, a device may use adjacent carriers in the same frequency band to achieve an effectively broader bandwidth and a higher data rate. To take still another example, some network operators may use multiple communication protocols simultaneously, such as a combination of code division multiple access (CDMA), third generation partnership project (3GPP), and long term evolution (LTE). Such an approach may be taken, for example, to allow for simultaneous voice and data communication. Uplink carrier aggregation, as well as the use of multiple communication protocols for transmission, employs multiple transmitters and introduces a risk of radio frequency (RF) frequency mixing or intermodulation due to nonlinearity of components. Downlink carrier aggregation employs one transmitter and multiple receivers and introduces the risk of radio frequency (RF) frequency mixing or harmonic generation due to nonlinearity of components. Components that carry particular risk of nonlinearity include those used for active, tunable, or switchable antennas.

Embodiments of the present invention further recognize that the need to accommodate multiple frequency bands tends to increase the size and complexity of antenna configurations, and that even if users are willing to accept a relatively large device size, the need for compactness, simplicity, and efficiency of components is still keenly felt among manufacturers. Embodiments of the present invention therefore provide compact and efficient antenna designs that allow for coverage of multiple frequency bands by a portable communications device.

For example, a portable communications device is configured to communicate using at least one configuration using multiple transmitters, such as uplink carrier aggregation or simultaneous voice and data. One or more connections may be controlled between an active tuner and an antenna passively tuned to specified frequency ranges, so as to select coverage of the specified frequency ranges to which the antenna is passively tuned or frequency ranges that may be different than the specified frequency ranges to which the antenna is passively tuned. Configurations involving multiple transmitters requiring good linearity performance, such as uplink carrier aggregation or simultaneous voice and LTE, would be covered passively by the antenna with the tuner bypassed and isolated. Active tuning would be utilized for configurations involving single transmitters for extending the bandwidth coverage of the antenna. Active tuning could also be used in configurations involving multiple transmitters when good linearity performance is not required.

Embodiments of the invention provide for the use of an active tuner in combination with an antenna. The antenna is tuned to provide passive coverage over specified frequency ranges, and the tuner may be connected to the antenna to adjust the range of coverage to include additional bands. When such adjustment of the range of coverage is not needed, the active tuner may be disconnected from the antenna, with disconnection being performed in such a way as to isolate the tuner from the antenna. Connection and disconnection may be performed by appropriate switches or combinations of switches.

FIG. 1 illustrates a network 100 in which a macro eNodeB (eNB) 102 defines a macro cell 104, and a femto eNB 106 defines a femto cell 108. The network 100 may serve a portable communications device 110, which may lie within the femto cell 108 and the macro cell 104 and may be able to be connected to the macro eNB 102 or the femto eNB 106, or, using carrier aggregation, to both the macro eNB 102 and the femto eNB 106. Another portable communications device 112 may lie within the macro cell 104 and may be able to connect to the macro eNB 102 in a dual communication mode, in which the eNB 102 uses two transmitters and two receivers. In one or more embodiments of the invention, a transmitter and receiver may be implemented in combination as a transceiver. The portable communications device 110 and the portable communications device 112 may use antenna assemblies according to one or more embodiments of the invention. Such assemblies may employ an antenna tuner that allows for providing different frequency ranges when needed. At other times, such as when high linearity performance by the antenna is needed, such assemblies may provide only the frequency ranges to which the antenna is passively tuned. For example, if the portable communications device 110 is using carrier aggregation, it may need high linearity performance by the antenna, and if the portable communications device 112 is engaging in dual communication modes it may need high linearity performance by the antenna. If the portable communications device 110 is communicating using only a single carrier, it could operate in the different frequency ranges enabled by the antenna tuner and if the portable communications device 112 is communicating in a single mode, it could operate in the different frequency ranges enabled by the antenna tuner.

Figure 2:
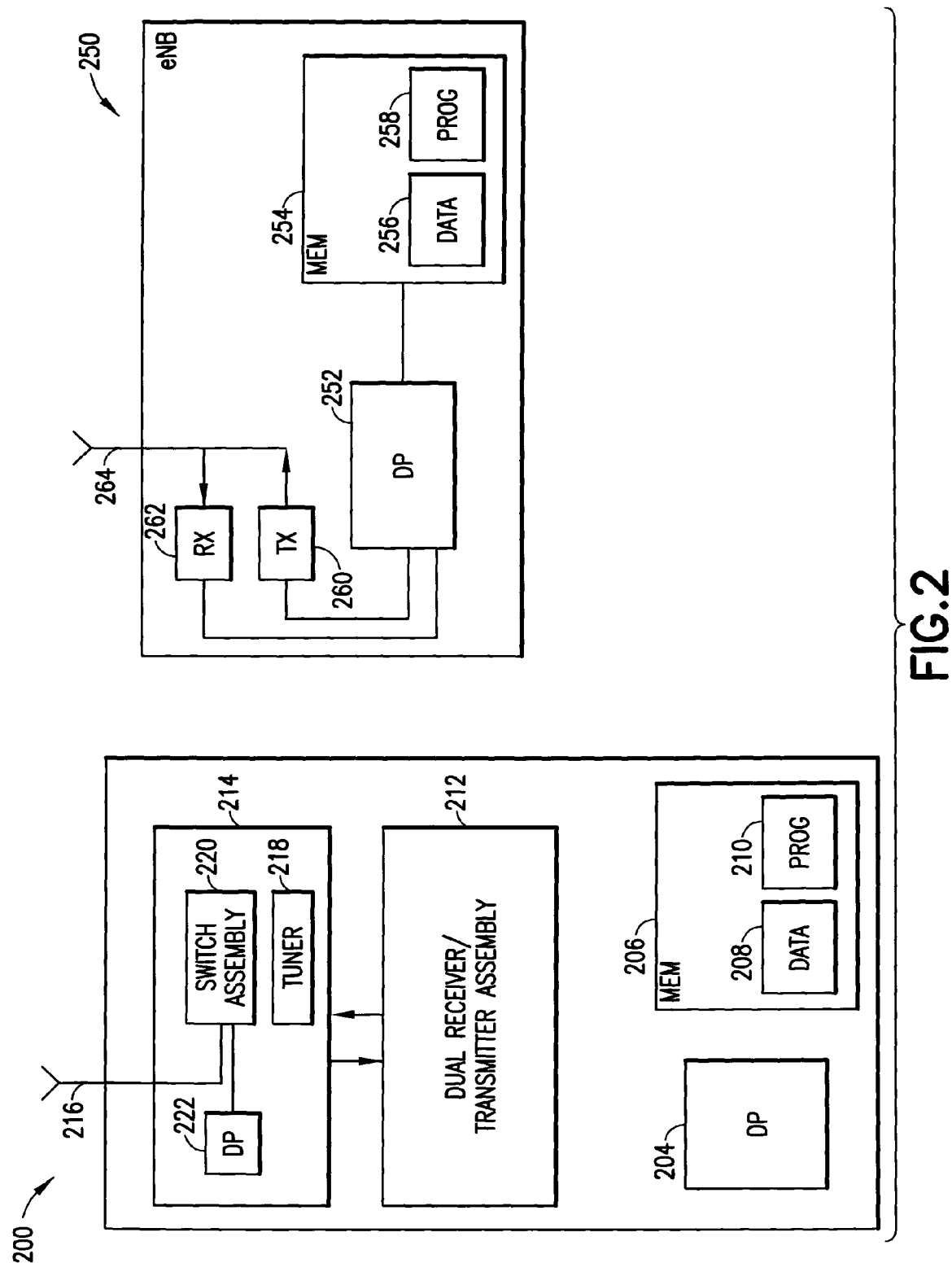
FIG. 2 illustrates elements that may be used in practicing embodiments of the present invention.

FIG. 2 illustrates details of a portable communications device which may suitably be implemented as an user equipment (UE) 200, configured according to one or more embodiments of the present invention. The portable communications device 200 comprises a data processor (DP) 204, memory (MEM) 206, with data 208 and software in the form of one or more programs 210 residing in the memory 206. The portable communications device 200 further comprises a dual receiver/transmitter assembly 212, transmitting and receiving data using an antenna arrangement 214. The antenna arrangement includes an antenna 216, which may be tuned so as to cover specified frequency bands. The frequency ranges of the antenna arrangement 214 may be adjusted by the use of an active tuner 218, which may be connected to or disconnected from the antenna 216 by a switching assembly 220 under the control of a data processor 222. A dedicated data processor 222 is illustrated here, but it will be recognized that control of the switching assembly 220 may be accomplished by the processor 204, or any other suitable processor, and the processor controlling switching need not be, and generally will not be, a part of the antenna arrangement.

FIG. 2 further illustrates a base station, suitably implemented as an eNB 250, which comprises a data processor (DP) 252 and memory (MEM) 254, with the memory storing data 256 and software in the form of one or more programs (PROGs) 258. The eNB 250 further comprises a transmitter 260 and receiver 262, for communicating with one or more devices such as the UE 200 using an antenna 264.

At least one of the PROGs 210 in the UE 200 is assumed to include a set of program instructions that, when executed by the associated DP 204, enable the device to operate in accordance with the exemplary embodiments of this invention, as detailed above. In these regards the exemplary embodiments of this invention may be implemented at least in part by computer software stored on the MEM 206, which is executable by the DP 204 of the UE 200, or by hardware, or by a combination of tangibly stored software and hardware (and tangibly stored firmware).

Similarly, at least one of the PROGs 258 in the eNB 250 is assumed to include a set of program instructions that, when executed by the associated DP 252, enable the device to operate in accordance with the exemplary embodiments of this invention, as detailed above. In these regards the exemplary embodiments of this invention may be implemented at least in part by computer software stored on the MEM 254, which is executable by the DP 252 of the eNB 250, or by hardware, or by a combination of tangibly stored software and hardware (and tangibly stored firmware). Electronic devices implementing these aspects of the invention need not be the entire devices as depicted at FIG. 2 or may be one or more components of same such as the above described tangibly stored software, hardware, firmware and DP, or a system on a chip SOC or an application specific integrated circuit ASIC.

In general, the various embodiments of the UE 200 can include, but are not limited to personal portable digital devices having wireless communication capabilities, including but not limited to cellular telephones, smart phones, navigation devices, laptop/palmtop/tablet computers, digital cameras and music devices, and Internet appliances.

Various embodiments of the computer readable MEM 206, and 254 include any data storage technology type which is suitable to the local technical environment, including but not limited to semiconductor based memory devices, magnetic memory devices and systems, optical memory devices and systems, fixed memory, removable memory, disc memory, flash memory, DRAM, SRAM, EEPROM and the like. Various embodiments of the DP 204, and 252 include but are not limited to general purpose computers, special purpose computers, microprocessors, digital signal processors (DSPs) and multi-core processors.

Figure 3:
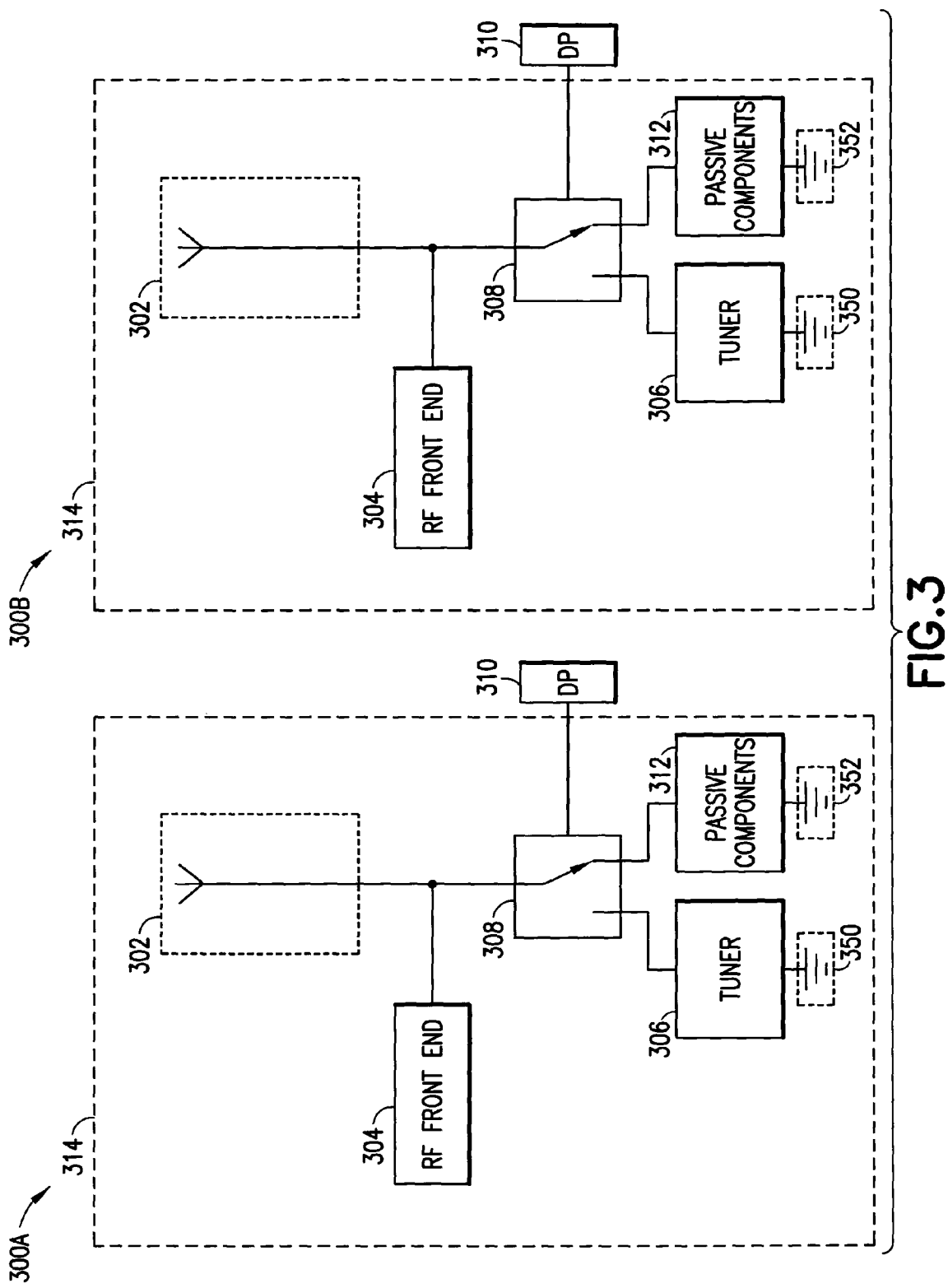
FIGS. 3-6, 7A-7D, 8A-8C, 9A, and 9B illustrate antenna configurations according to embodiments of the present invention.

FIG. 3 illustrates an antenna arrangement 314 according to an embodiment of the present invention. The arrangement 314 comprises an antenna 302, passively tuned so as to match bands of interest. The arrangement 314 is connected to a radio frequency (RF) front end circuit 304, which serves as an intermediary between signals emanating from or received by the antenna and a first intermediate state of a device in which the antenna is used. The RF front end 304 processes the incoming signal received at the antenna 302, and prepares signals for transmission from the antenna 302. The RF front end may, for example, comprise components such as, and not limited to, an impedance matching circuit, a band pass filter, a radio frequency amplifier, a mixer, duplexers, switches, low noise amplifiers, and other components needed for processing. Expanding the frequency range covered by the antenna tends to require a larger antenna. Therefore, in order to adjust the frequency range covered by the antenna while maintaining a compact size, the exemplary embodiment illustrated provides for a tuner 306 connected to the antenna 302 through a highly linear switch 308, which may suitably operate under the control of a data processor 310. In the example embodiment the RF front end 304 is arranged so that it is directly electrically coupled to the antenna 302. In other words, the data processor 310, switch 308, tuner 306 and passive components 312 are not intermediately disposed between the antenna 302 and the RF front end 304. This approach allows for a first tuning configuration 300A and a second tuning configuration 300B. In the second tuning configuration 300B, the switch 308 is configured to connect the tuner 306 to the antenna 302 which can also be described as an on-state. Alternatively, in the first tuning configuration 300A, the switch 308 is configured to disconnect the tuner 306 from the antenna 302 which can also be described as an off-state. When the tuner 306 is connected as illustrated in FIG. 3, then multiple states of the tuner would be applied to the antenna in order to adjust the frequency range covered by the antenna. When the tuner 306 is disconnected from the antenna 302 as illustrated in FIG. 3, then the antenna is connected to ground through the switch 308 and passive components 312. Only isolation or disconnection of the switch 308 in the off-state provides protection for the active tuner. Although the switch 308 is illustrated in FIG. 3 as a single pole double throw (SPDT) switch, this may be exchanged for any switch capable of disconnecting the antenna 302 from the tuner 306, for example and not limited to, a single pole single throw (SPST) switch (not illustrated).

Figure 4:
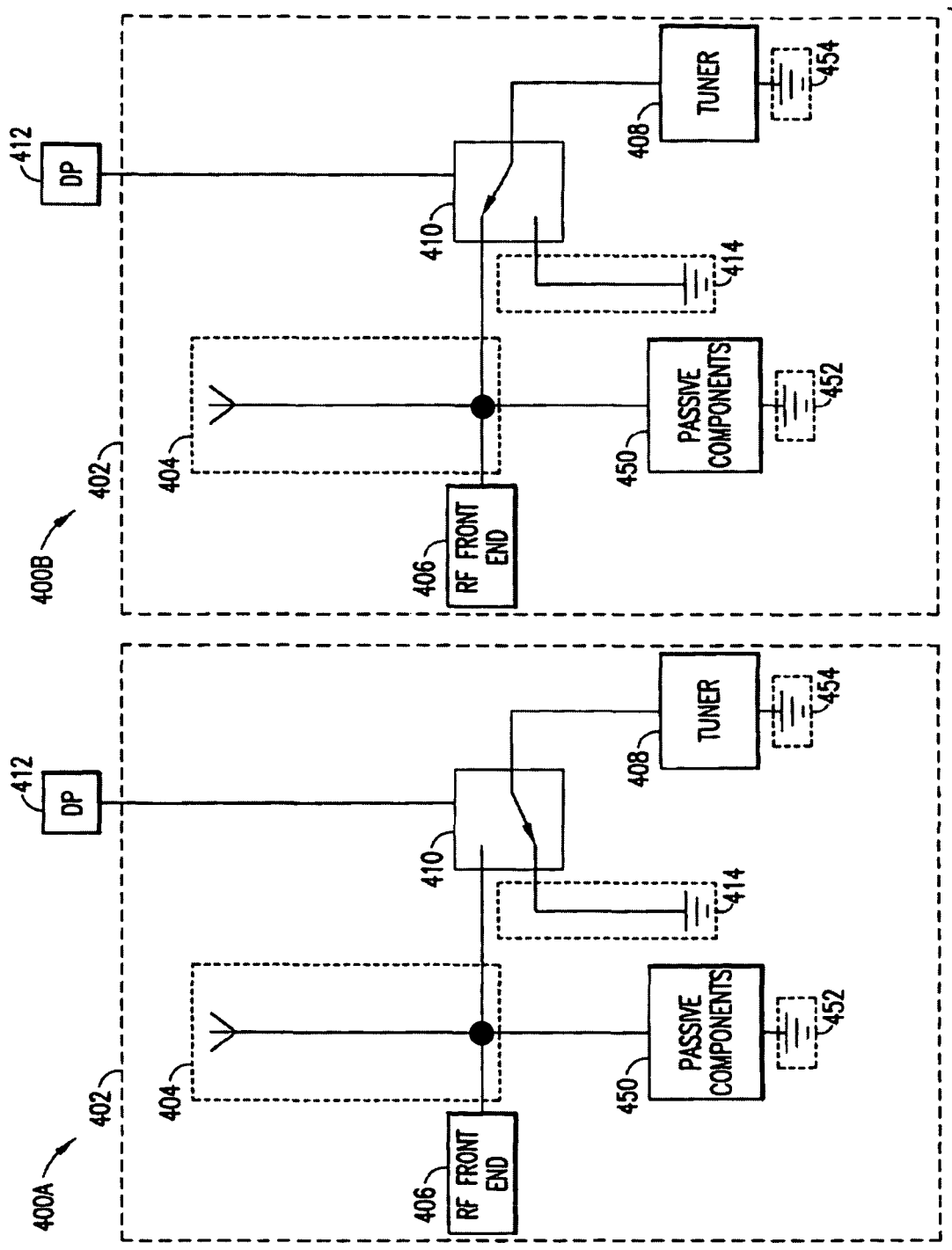

FIG. 4 illustrates two tuning configurations 400A and 400B, being first and second tuning configurations respectively, of an antenna arrangement 402, according to another embodiment of the invention. An antenna 404 is connected to an RF front end 406, and is connected to a tuner 408 in such a way that the tuner may be isolated or connected, as needed, by a switch 410. The switch 410 may operate under the control of a data processor 412. When a band of frequency ranges is used that are optimal for the passive tuning of the antenna, the processor 412 operates the switch 410 so as to cause the arrangement 402 to enter the first tuning configuration 400A, with the switch 410 set so as to disconnect the tuner 408 from the antenna 404. In the first tuning configuration 400A, the tuner 408 is suitably connected to a ground 414. The antenna 404 is also connected to passive components 452, which are connected to a ground 454.

The use of the ground 414 more effectively isolates the tuner 408 when it is not needed. The ground 414 enhances isolation of the tuner, improves the linearity of the overall antenna plus tuning circuitry and reduces risk of RF mixing or intermodulation distortion. This is particularly useful when multiple transceivers are operating simultaneously and RF mixing or intermodulation can cause desensitization of the receivers.

When a different frequency range is needed, the processor 412 may control the switch 410 so as to cause the antenna arrangement 402 to enter the second tuning configuration 400B. The tuner 408 is connected directly to the antenna 404, so that all states of the second tuning configuration 400B are available. The first tuning configuration 400A typically would be used when both transmitters and receivers of a dual transmitter/receiver assembly are in use in order to communicate using carrier aggregation or dual communication modes, while the second tuning configuration 400B typically would be used when single band coverage was to be used, and would allow for a considerable extension of single band coverage.

The active tuning provided by the tuner 408 can provide for differing frequency ranges when needed when the processor selects the second tuning configuration 400B, and when such differing frequency ranges are not needed, the active tuning can be dispensed with and effectively isolated by the processor selecting the first tuning configuration 400A.

Embodiments of the invention may suitably comprise arrangements including multiple antennas, with one or more of the antennas configured similarly to the antenna arrangement 314, the antenna arrangement 402, or any other combination of antenna assemblies having designs configured according to embodiments of the invention.

Figure 5:
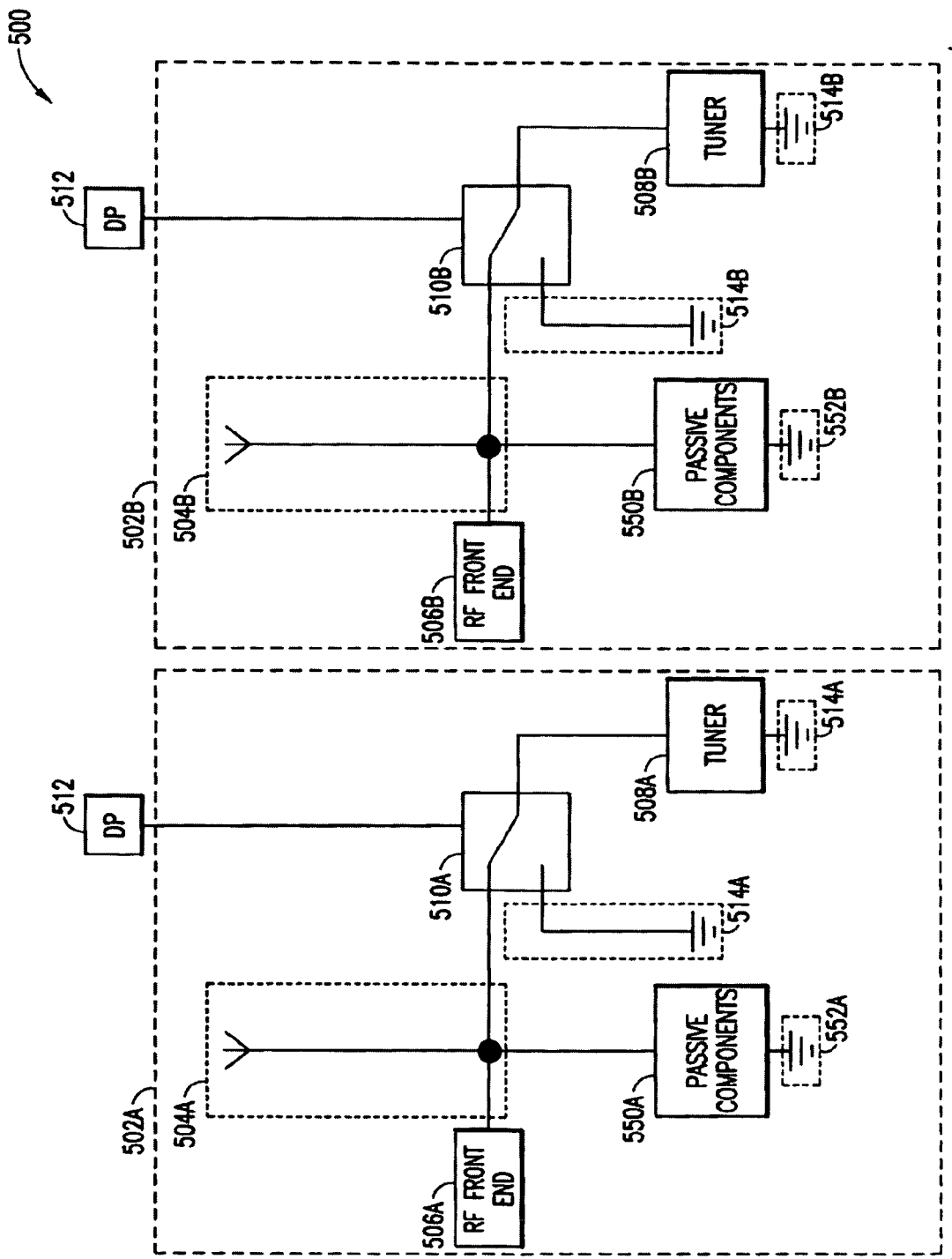

FIG. 5 illustrates a multiple antenna array 500 according to an embodiment of the present invention, comprising an array of two antenna arrangements 502A and 502B. In the present illustrated embodiment, either or both of the arrangements 502A and 502B may be similar to the arrangement 402 of FIG. 4. The arrangement 502A comprises an antenna 504A and is connected to an RF front end 506A. The arrangement 502A includes an active tuner 508A, which may be connected to or disconnected from the antenna 504A by a switch 510A. The switch 510A may operate under the control of a data processor 512A. The switch 510A may be operable to connect the tuner 508A to an isolating ground 514A. The antenna 504A is connected to passive components 550A, which are connected to a ground 552A.

The arrangement 502B comprises its antenna 504B and is connected to an RF front end 506B. The arrangement 502B includes an active tuner 508B, which may be connected to or disconnected from the antenna 504B by a switch 510B. The switch 510B may operate under the control of a data processor 512B. The switch 510B may be operable to connect the tuner 508B to an isolating ground 514B. The antenna 504B is connected to passive components 550B, which are connected to a ground 552B.

An array such as the array 500 can be configured in any number of different ways to achieve different objectives. For example, the antenna 504A and the antenna 504B may be passively tuned to cover different or even the same frequency bands. The tuner 508A with antenna 504A may be configured to cover different frequencies than the frequencies passively covered by the antenna 504A, and the tuner 508B with the antenna 504B may be configured to cover the same frequencies as the tuner 508A with the antenna 504A or other frequencies. Such an approach provides a broader coverage than would be available with a single antenna arrangement. To take another example, the antenna arrangements 502A and 502B may be configured to cover non-adjacent bands that may be used by different base stations to which a device using the antenna array may connect. It will be noted that one possible configuration is to have only one transmitter operating on each antenna rather than having both transmitters operating on a single antenna.

Figure 6:
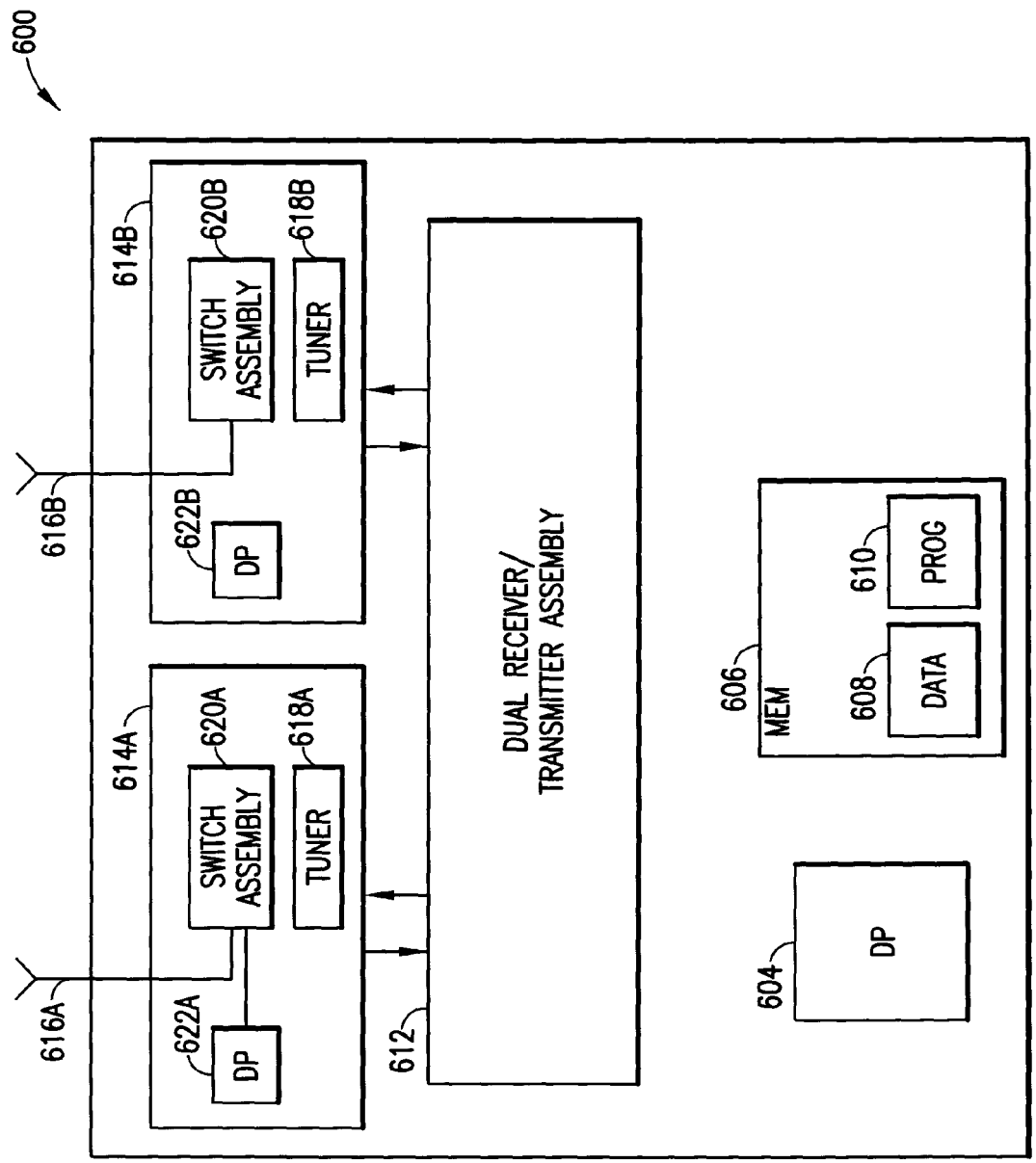

A multiple antenna array 500 such as that illustrated in FIG. 5 may be used, for example, in a portable communications device such as the device 600 of FIG. 6, comprising a data processor (DP) 604, memory (MEM) 606 storing data 608 and programs 610, and multi-receiver/transmitter assembly 612, served by antenna arrangements 614A and 614B. The antenna arrangement 614A comprises an antenna 616A configured to be connected to a tuner 618A using a switch assembly 620A that is controlled by a processor 622A. The antenna arrangement 614B comprises an antenna 616B configured to be connected to a tuner 618B using a switch assembly 620B that is controlled by a processor 622B. The device 600 may be configured so that each of the antennas 616A and 616B has a passive tuning state supporting dual transmitter modes, and with one transmitter connected to each antenna arrangement 614A and 614B. When operating in a two transmitter configuration, antenna 616A may require a highly linear tuning state where tuner 618A is disconnected and isolated in order to avoid RF mixing and intermodulation from a signal transmitted by antenna 616A and the signal coupled from the other antenna 616B. When operating in a two transmitter configuration, antenna 616B may require a highly linear tuning state where tuner 618B is disconnected and isolated in order to avoid RF mixing and intermodulation. Such mixing and intermodulation may occur, for example, when a signal different from that transmitted by the antenna 616A arrives at the antenna 616A and causes intermodulation. Such a signal, for example, may be a signal transmitted from the antenna 616B and arriving at the antenna 616A.

In another embodiment of the invention, a portable communications device such as the device 600 may be configured so that two transmitters provided by the multi-receiver/transmitter assembly 612, operate on a single antenna, for example, antenna 616A, with the other antenna 616B functioning in receive only mode and supporting diversity/MIMO communication. Two transmitters could operate on one antenna 616A and two receivers could operate on the second antenna 616B. Antenna 616A could also be connected to two receivers. When operating in a two transmitter configuration, antenna 616A may require a highly linear tuning state where its tuner 618A is disconnected and isolated in order to avoid RF mixing and intermodulation of the two signals transmitted on antenna 616A. When operating in a two transmitter configuration, antenna 616B may also require a highly linear tuning state where its tuner 618B is disconnected and isolated in order to avoid RF mixing and intermodulation from signals transmitted by antenna 616A and coupled onto antenna 616B.

FIGS. 7A-7D, 8A-8C and 9A-9B illustrate various antenna arrangements 700A-700D, 800A-800C and 900A-900B, respectively, using different switch configurations providing different current flows, voltage drops and isolation mechanisms.

Figure 7A:
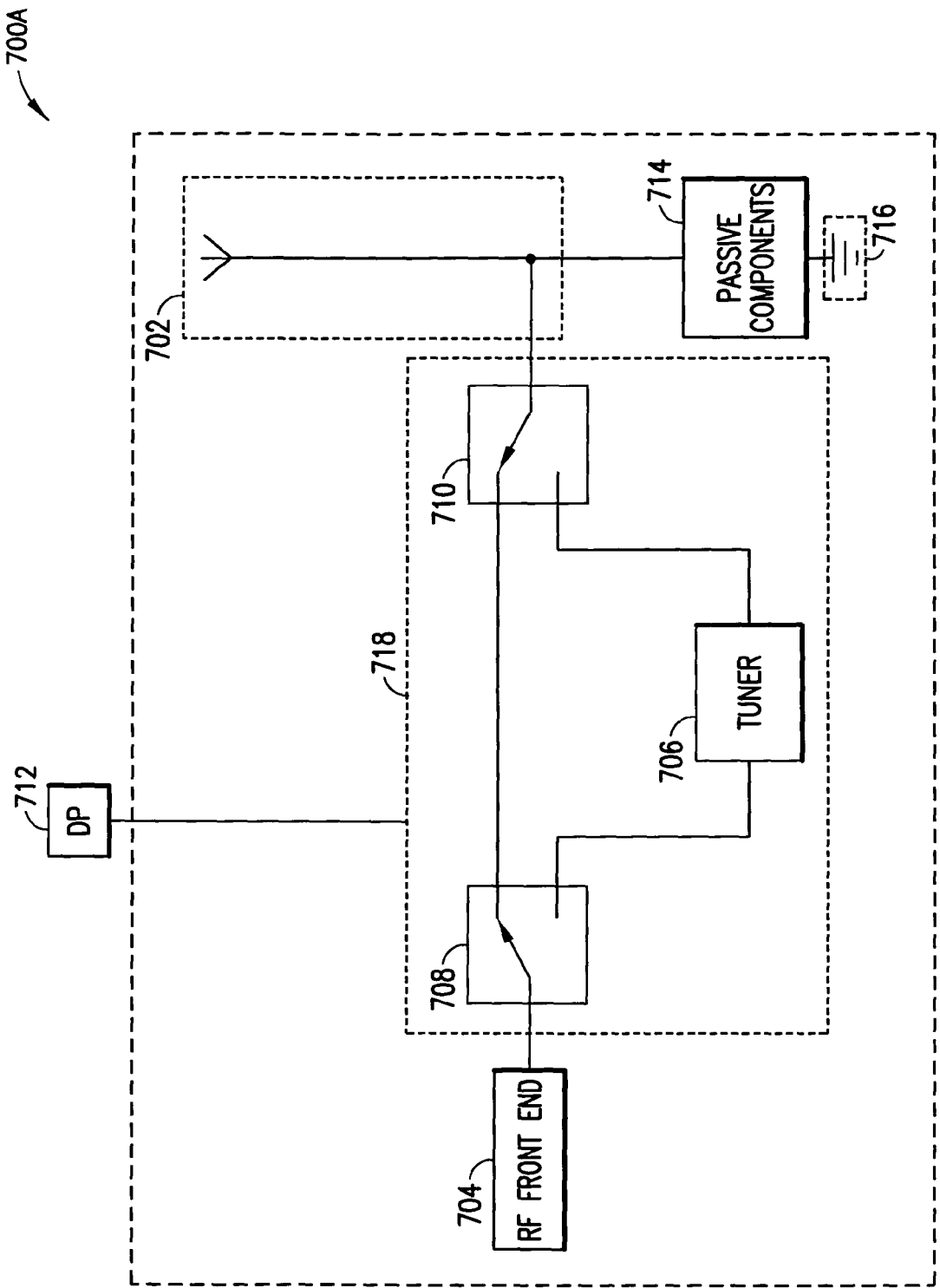

In an embodiment as illustrated in FIG. 7A, the antenna arrangement 700A comprises an antenna 702, connected to a radio frequency front end 704 via a switch-tuner arrangement 718 such that the switch-tuner arrangement 718 is in series electrical connection between the antenna 702 and the RF front end 704. The switch arrangement 718 comprises a tuner 706, with single pole double throw (SPDT) switches 708 and 710, which may be set in various states under the control of a data processor 712. For example, the switches 708 and 710 may be set so that the tuner 706 is connected to the front end 704 and the antenna 702, or may be connected so that the current (generally, RF current associated with received or transmitted RF signals) flowing between the front end 704 and the antenna 702 is re-routed around the tuner 706 to either the front end 704 or to the antenna 702 dependent on whether the current is received by the antenna 704 or transmitted by the antenna 704 respectively, isolating the tuner (as illustrated in FIG. 7A). The antenna arrangement 700A also comprises one or more passive components 714 as previously described in one or more embodiments, the passive components 714 configured to couple to ground 716. In this embodiment the one or more passive components 714 is directly coupled to the antenna 702 as illustrated in FIG. 7A in a shunt or parallel configuration to ground 716.

Figure 7B:
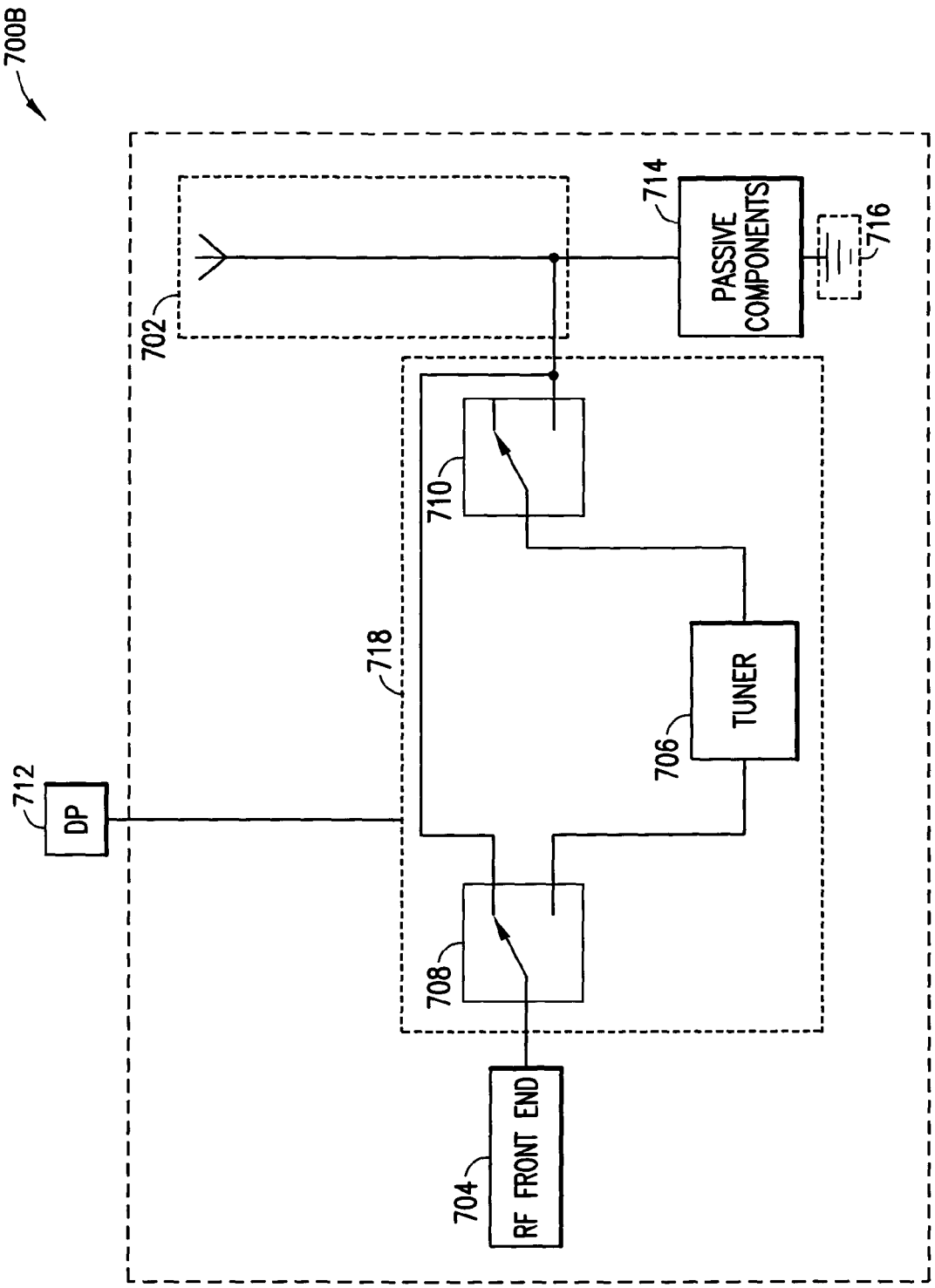

In an embodiment as illustrated in FIG. 7B, the antenna arrangement 700B represents a modification of the arrangement 700A, and comprises an antenna 702, with a radio frequency front end 704. The arrangement 700B comprises a tuner 706, with single pole double throw (SPDT) switches 708 and 710, which may be set in various states under the control of a data processor 712. For example, the switches 708 and 710 may be set so that the tuner 706 is connected to the front end 704 and the antenna 702, or may be connected so that current flowing between the front end 704 and the antenna 702 is re-routed around the tuner 706 to either the front end 704 or to the antenna 702 dependent on whether the current is received by the antenna 704 or transmitted by the antenna 704 respectively, with the routing being such that the switch 710 is connected to an open circuit when the current flowing between the front end 704 and the antenna 702 is being re-routed. In this embodiment the one or more passive components 714 is directly coupled to the antenna 702 as illustrated in FIG. 7B in a shunt or parallel configuration to ground 716. In an embodiment as illustrated by the antenna arrangement 700D of FIG. 7D, the switch 710 which is illustrated in FIG. 7B as a SPDT switch, is replaced by a single pole single throw (SPST) switch.

Figure 7C:
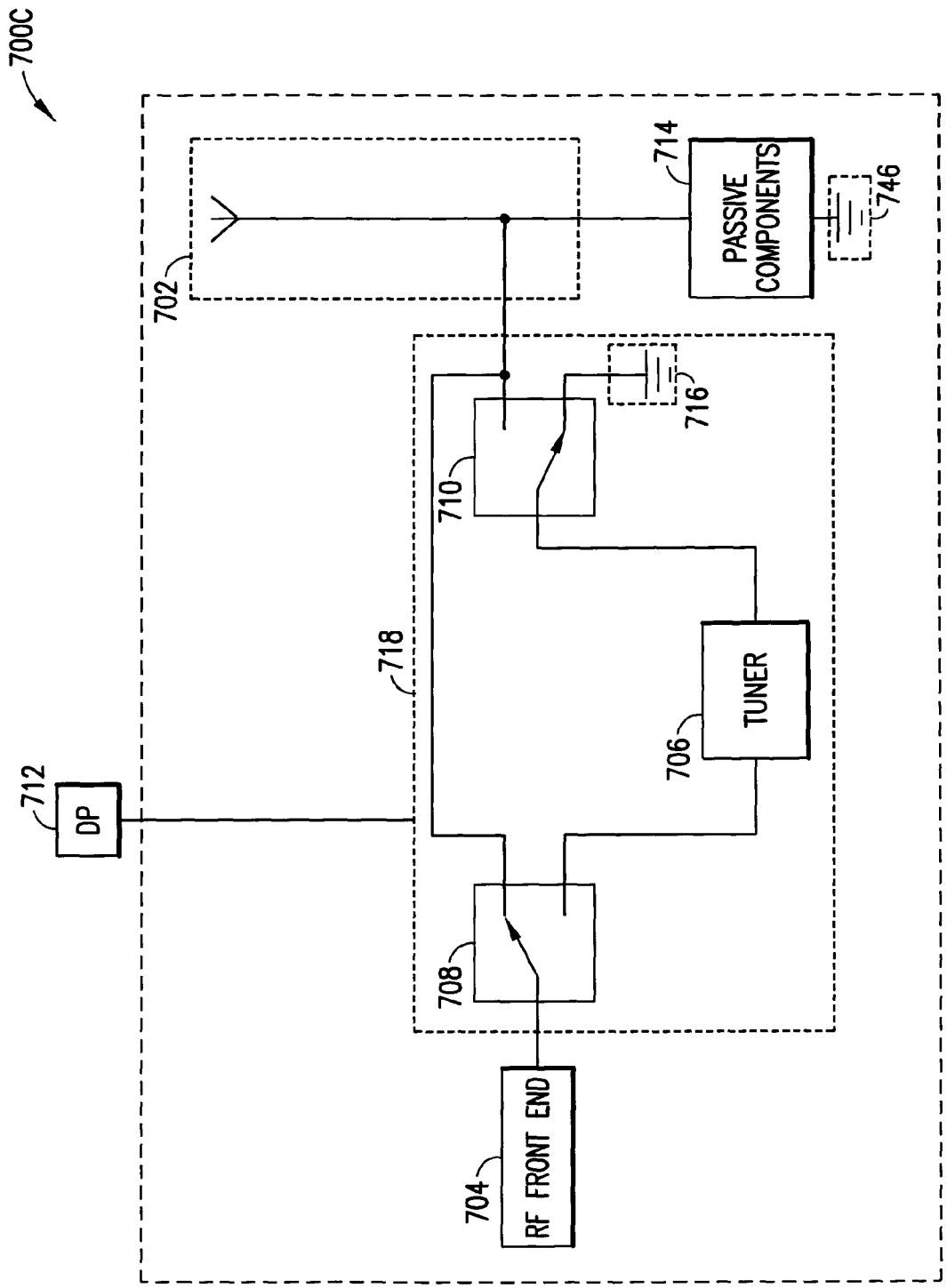
Figure 7D:
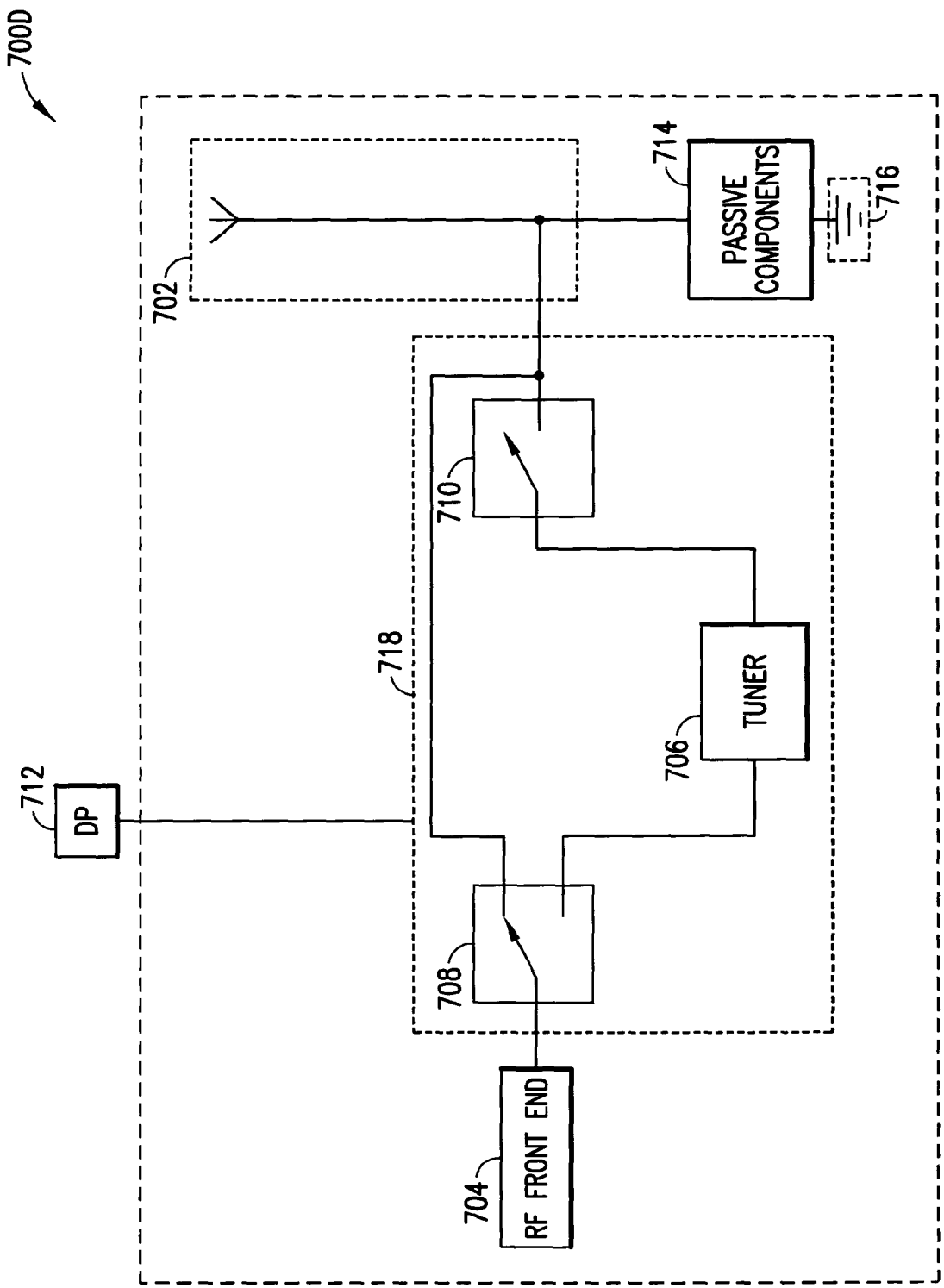

In an embodiment as illustrated in FIG. 7C, the antenna arrangement 700C represents a modification of the antenna arrangements 700A and 700B, and comprises an antenna 702, with a radio frequency front end 704. The arrangement 700C comprises a tuner 706, with single pole double throw (SPDT) switches 708 and 710, which may be set in various states under the control of a data processor 712. For example, the switches 708 and 710 may be set so that the tuner 706 is connected to the front end 704 and the antenna 702, or (as in the case of the arrangement 700B) may be connected so that current flowing between the front end 704 and the antenna 702 is re-routed to either the front end 704 or to the antenna 702 dependent on whether the current is received by the antenna 704 or transmitted by the antenna 704 respectively, with the routing being such that the switch 710 is connected to ground 716 when the current is being re-routed (as illustrated in FIG. 7C). In this embodiment the one or more passive components 714 is directly coupled to the antenna 702 as illustrated in FIG. 7C in a shunt or parallel configuration to ground 746.

Figure 8A:
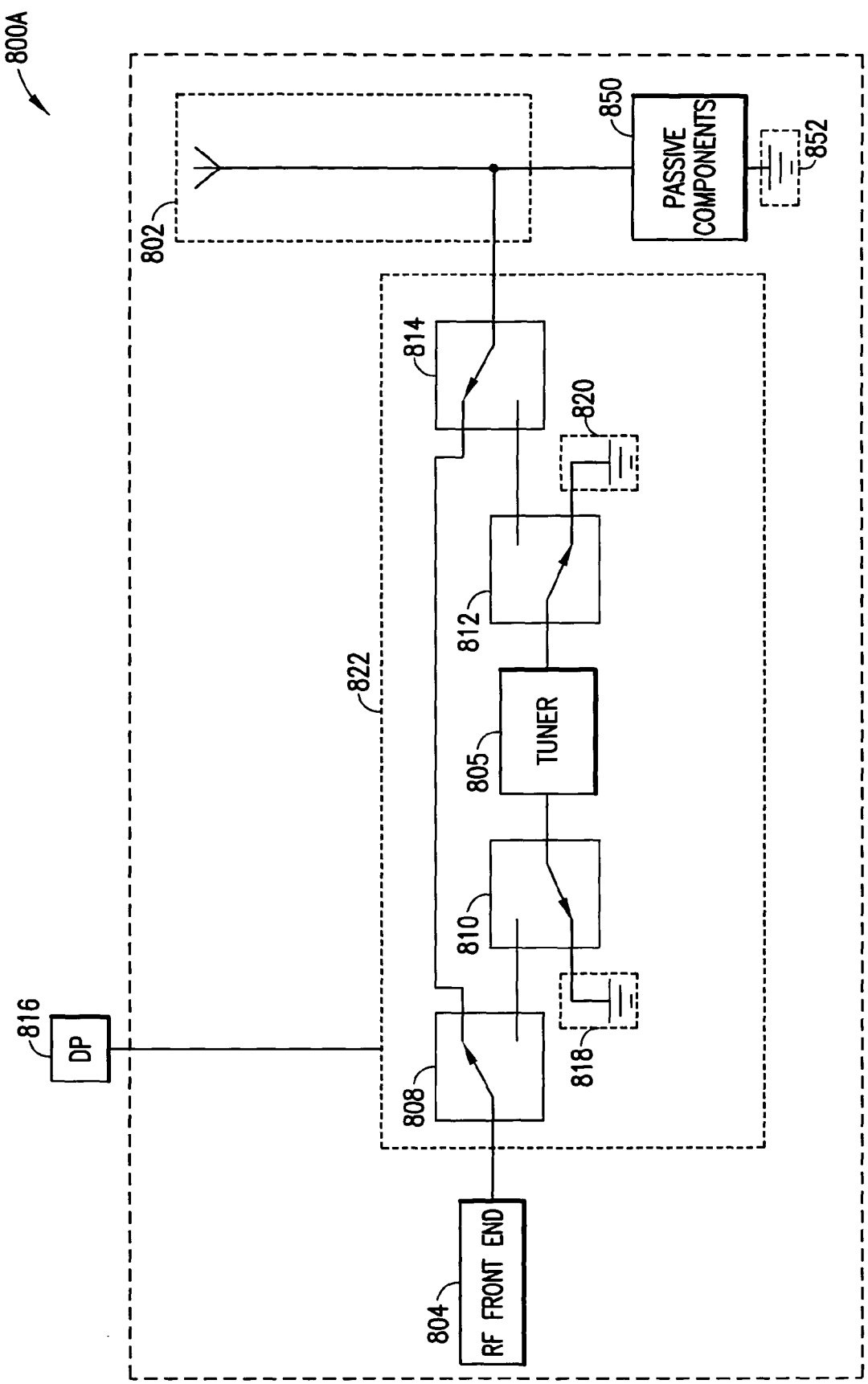

In an embodiment as illustrated in FIG. 8A, the antenna arrangement 800A comprises an antenna 802, connected to an RF front end 804 via a switch-tuner arrangement 822 such that the switch-tuner arrangement 822 is in series electrical connection between the antenna 802 and the RF front end 804. The antenna may be connected to passive components 850, which are connected to ground 852. The switch-tuner arrangement 822 comprises a tuner 806 and single pole double throw (SPDT) switches 808, 810, 812, and 814, which can be set in different states, suitably under the control of a data processor 816. For example, the switches can be set so as to set the tuner in series with the front end 804 and the antenna 802, or the switches 808 and 814 can be set so as to form a series connection bypassing the tuner 806 and the switches 810 and 812 can be set so as to isolate the tuner 806 by connecting it to the grounds 818 and 820 (as illustrated in FIG. 8A).

Figure 8B:
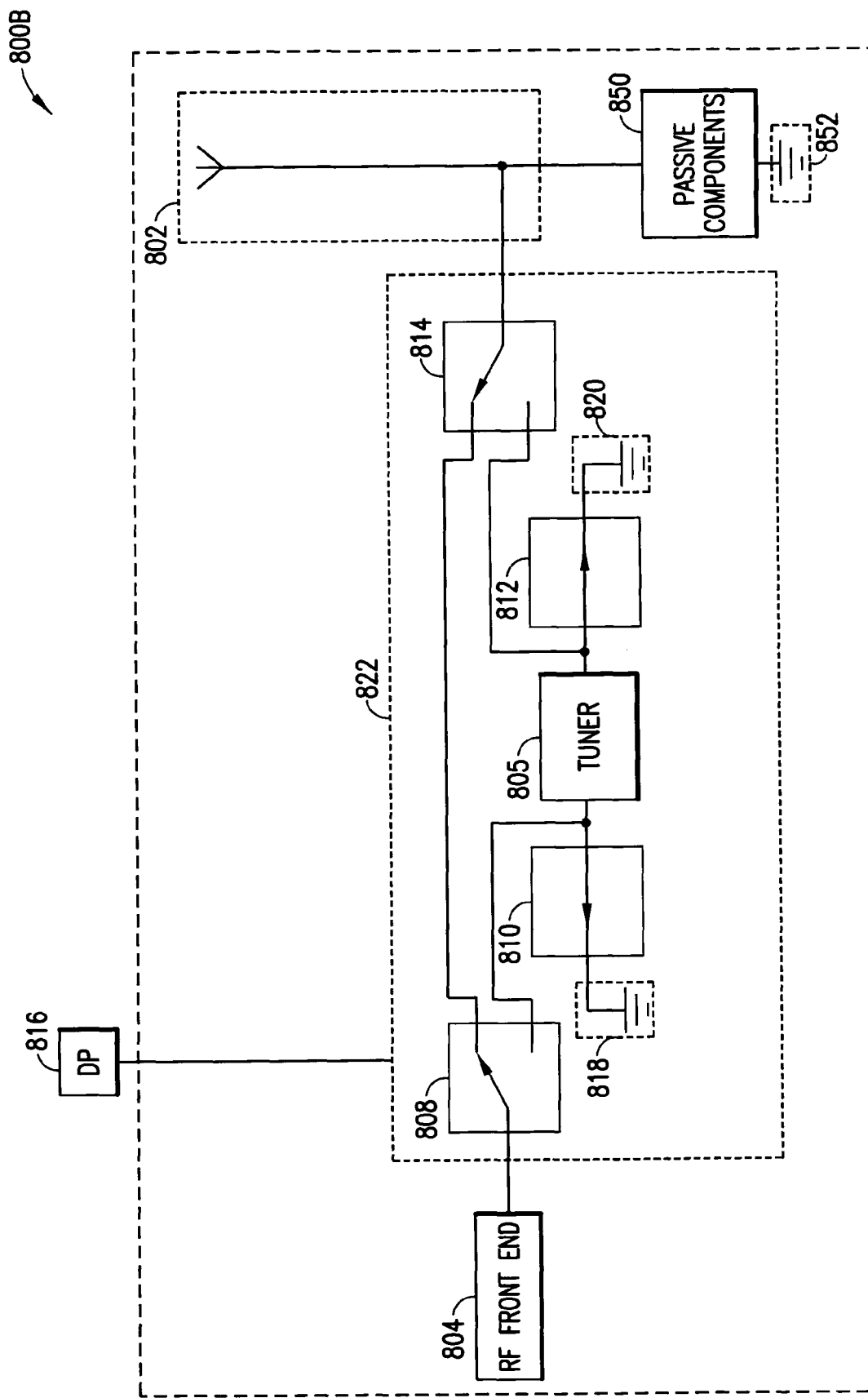

In an embodiment as illustrated in FIG. 8B, the antenna arrangement 800B comprises an antenna 802, connected to an RF front end 804 via a switch-tuner arrangement 822 such that the switch-tuner arrangement. 822 is in series electrical connection between the antenna 802 and the RF front end 804. The antenna may be connected to passive components 850, which are connected to ground 852. The switch-tuner arrangement 822 comprises a tuner 806 and single pole double throw (SPDT) switches 808 and 814 and single pole single throw (SPST) switches 810 and 812, which can be set in different states, suitably under the control of a data processor 816. For example, the switches can be set so as to set the tuner in series with the RF front end 804 and the antenna 802 by connecting the front end 804 to the tuner 806 using switch 808 and connecting the tuner 806 to the antenna 802 using switch 814, with switches 810 and 812 set such that they are open. The second state would have the switches 808 and 814 set so as to form a series connection bypassing the tuner 806 and the switches 810 and 812 set so as to isolate the tuner 806, connecting it to the grounds 818 and 820 (as illustrated in FIG. 8B).

Figure 8C:
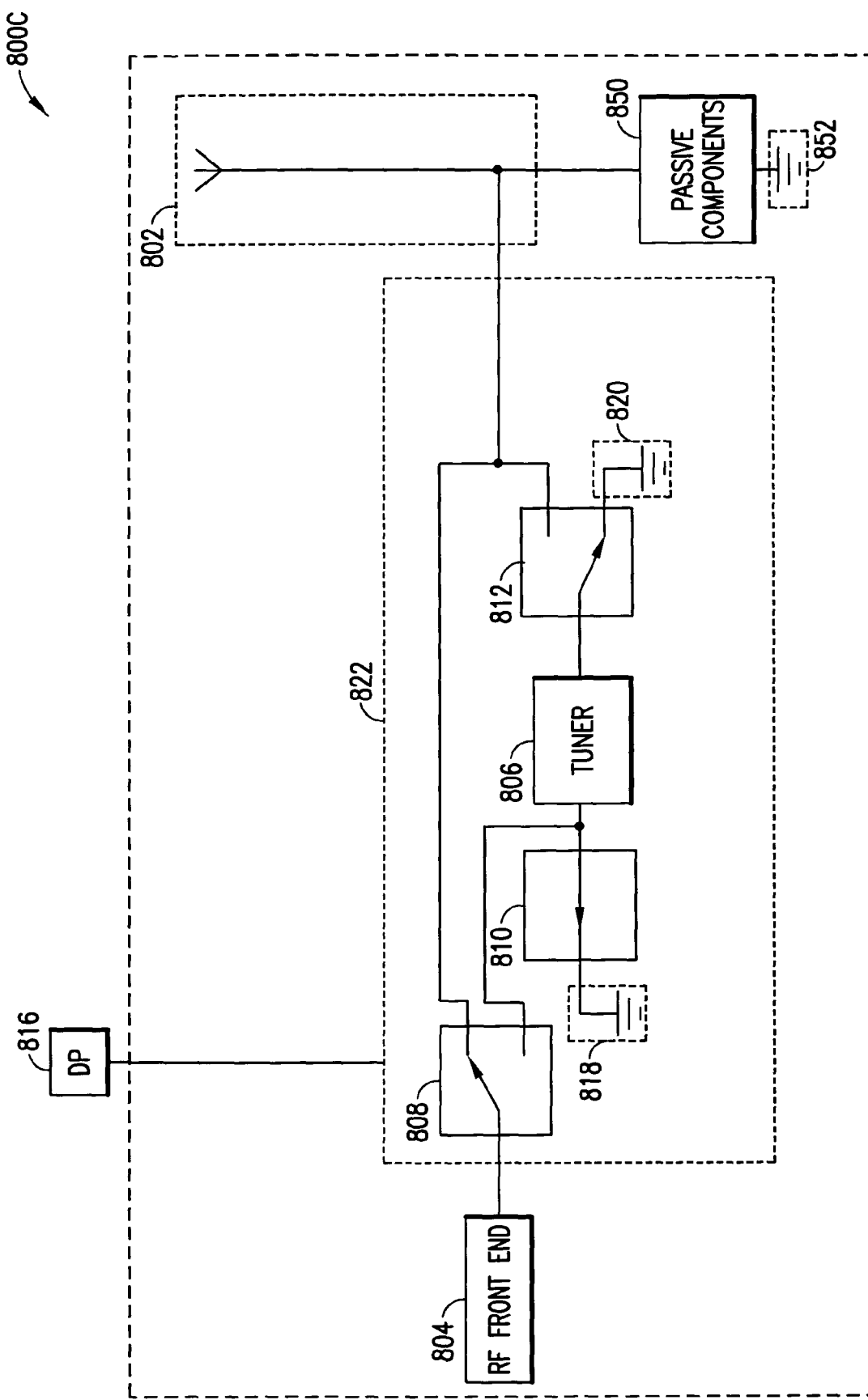

In an embodiment as illustrated in FIG. 8C, the antenna arrangement 800C comprises an antenna 802, connected to an RF front end 804 via a switch-tuner arrangement 822 such that the switch-tuner arrangement 822 is in series electrical connection between the antenna 802 and the RF front end 804. The antenna may be connected to passive components 850, which are connected to ground 852. The switch-tuner arrangement 822 comprises a tuner 806 and single pole double throw (SPDT) switches 808, and 812 and single pole single throw (SPST) switch 810, which can be set in different states, suitably under the control of a data processor 816. For example, the switches can be set so as to set the tuner in series with the RF front end 804 and the antenna 802 by connecting the front end to the tuner 806 using switch 808 and connecting the tuner 806 to the antenna 802 using switch 812, with switch 810 set to open. The second state would have the switch 808 set so as to form a series connection bypassing the tuner 806 and the switches 810 and 812 set so as to isolate the tuner 806, connecting it to the grounds 818 and 820 (as illustrated in FIG. 8C).

Figure 9A:
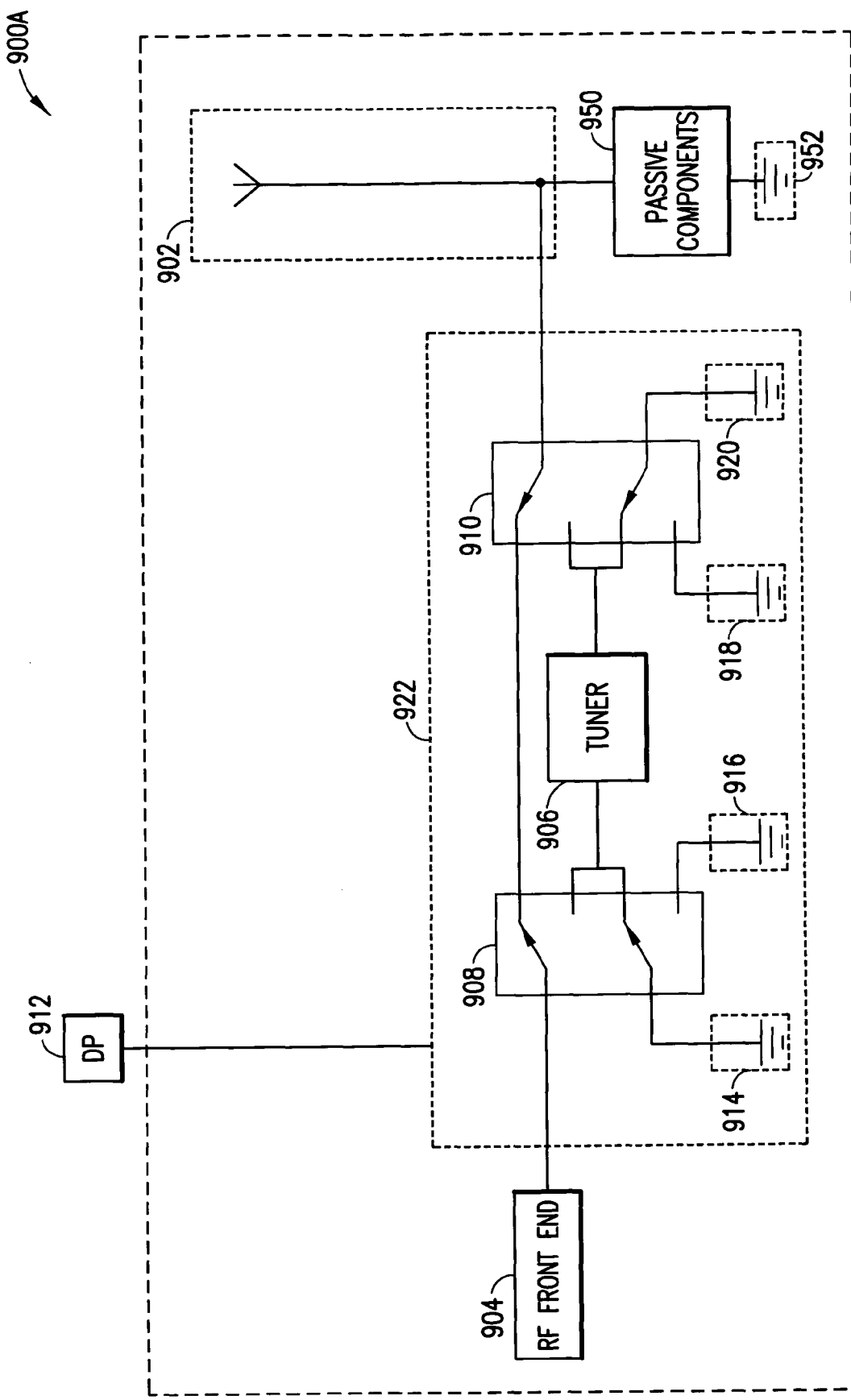

In an embodiment as illustrated in FIG. 9A, the antenna arrangement 900A comprises an antenna 902, a switch-tuner arrangement 922 and a radio frequency front end 904. The antenna may be connected to passive components 950, which are connected to ground 952. The switch-tuner arrangement 922 comprises a tuner 906. The switch-tuner arrangement 922 further comprises double pole double throw (DPDT) switches 908 and 910 which may be operated under the control of a data processor 912 so as to be set in any number of states. For example, the switches can be set so as to pass current between the RF front end 904 and the antenna 902, bypassing the tuner 906 (as illustrated in FIG. 9A), or can be set to place the tuner 906 in series with the front end 904 and the antenna 902. If the switches 908 and 910 are set to bypass the tuner 906, they may simultaneously be set to connect the tuner 906 to one or more of the grounds 914 and 920. Such a configuration disconnects the tuner 906 from the antenna 902 and effectively isolates it from the antenna 902.

Figure 9B:
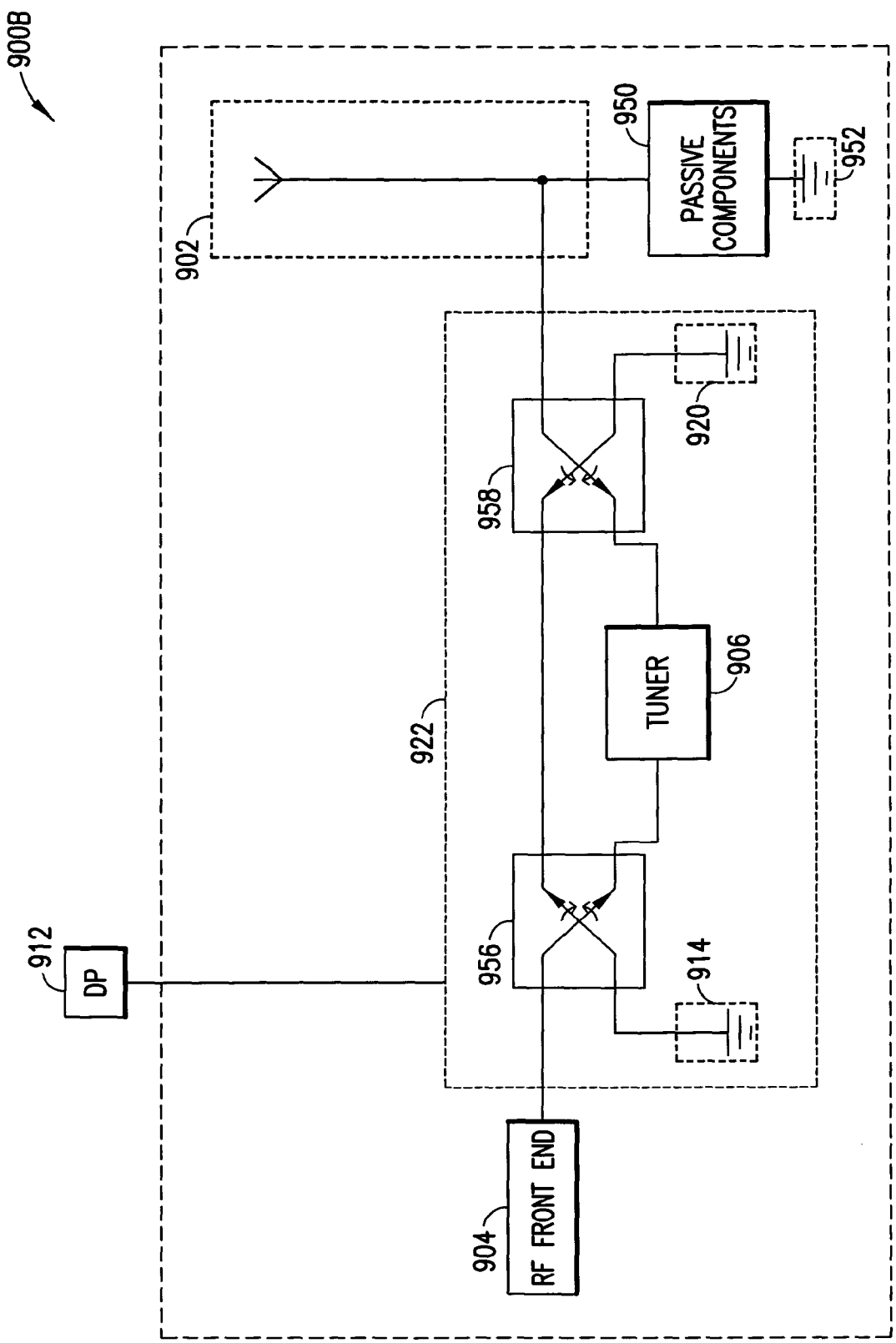

In an embodiment as illustrated in FIG. 9B, the antenna arrangement 900B comprises an antenna 902, a RF front end 904 and a switch-tuner arrangement 922. The antenna may be connected to passive components 950, which are connected to ground 952. Rather than the DPDT switches 908 and 910 shown in FIG. 9A, the switch arrangement is replaced by another pair of DPDT switches 956 and 958 configured such that, for each DPDT switch, the two inputs can be connected to either output through each of 2 states of the DPDT switch). The embodiment 900B is generally configured in a way similar to that of the embodiment 900A. The switches can be set so as to pass current from the RF front end 904 to the antenna 902, bypassing the tuner 906, or can be set to place the tuner 906 in series with the RF front end 904 and the tuner 902 (as illustrated in FIG. 9B). If the switches 956 and 958 are set to bypass the tuner 906, they may simultaneously be set to connect the tuner 906 to one or more of the grounds 914 and 920. Such a configuration disconnects the tuner 906 from the antenna 902 and effectively isolates it from the antenna 902

Figure 10:
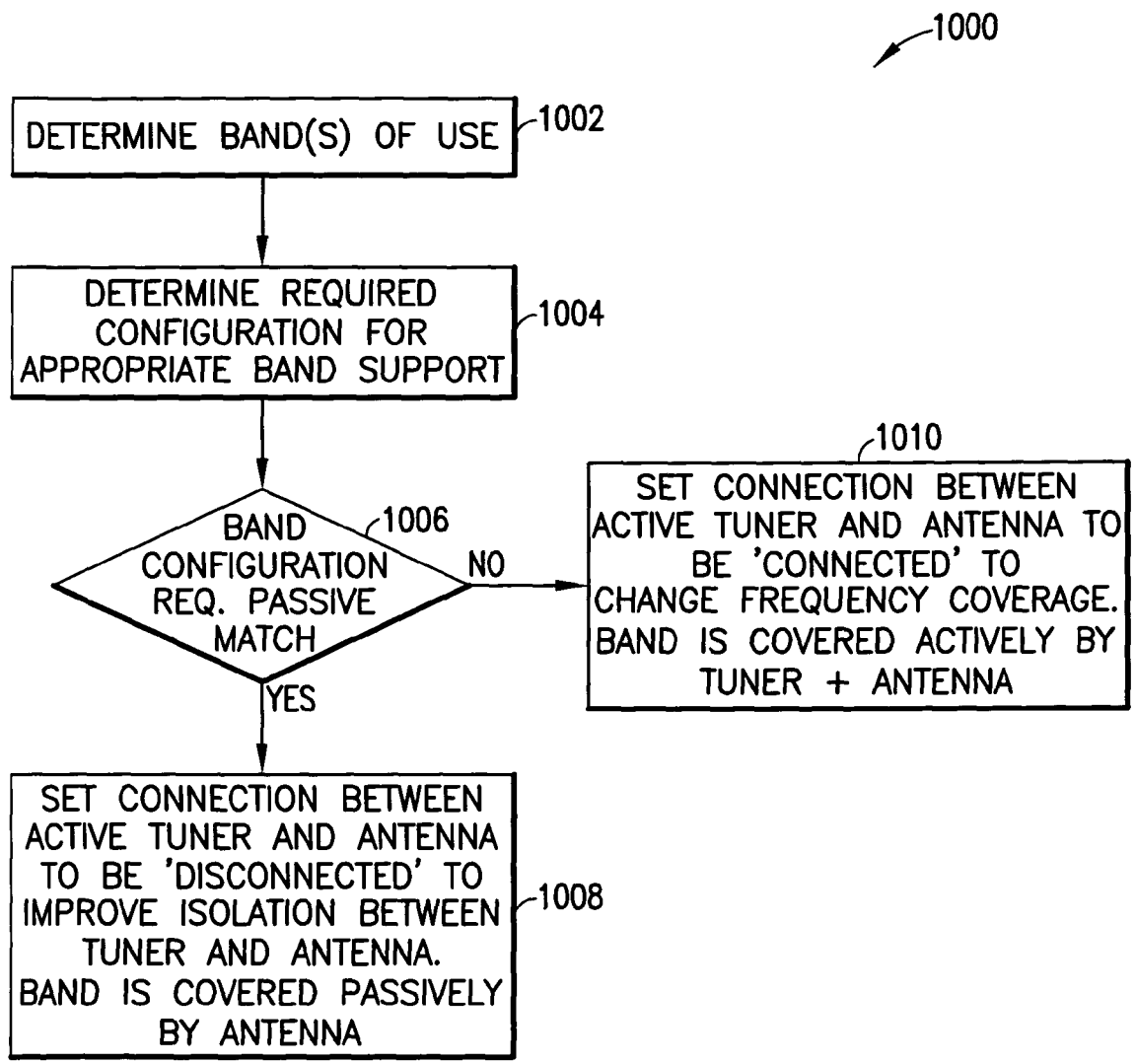
FIGS. 10 and 11 illustrate processes according to embodiments of the present invention.

FIG. 10 illustrates a process 1000 according to embodiments of the invention, suitably carried out using an antenna arrangement comprising an active tuner that can be connected to or disconnected from an antenna, and isolated when disconnected. At block 1002, a determination is made as to the frequency bands to be used. At block 1004, a determination is made as to the required configuration for support of the frequency band being used. At block 1006, a determination is made as to whether the needed configuration requires a passive match, that is, a match to the passive frequencies covered by the antenna. If yes, the process proceeds to block 1008 and a "disconnected" configuration between the antenna and the active tuner is set, or such a configuration is maintained, so as to improve isolation between the tuner and the antenna, so that the frequency band or bands are covered passively by the antenna. If no, the process proceeds to block 1010 and a "connected" configuration between the antenna and the active tuner is set or maintained, so as to allow for active coverage by the tuner/antenna combination.

Figure 11:
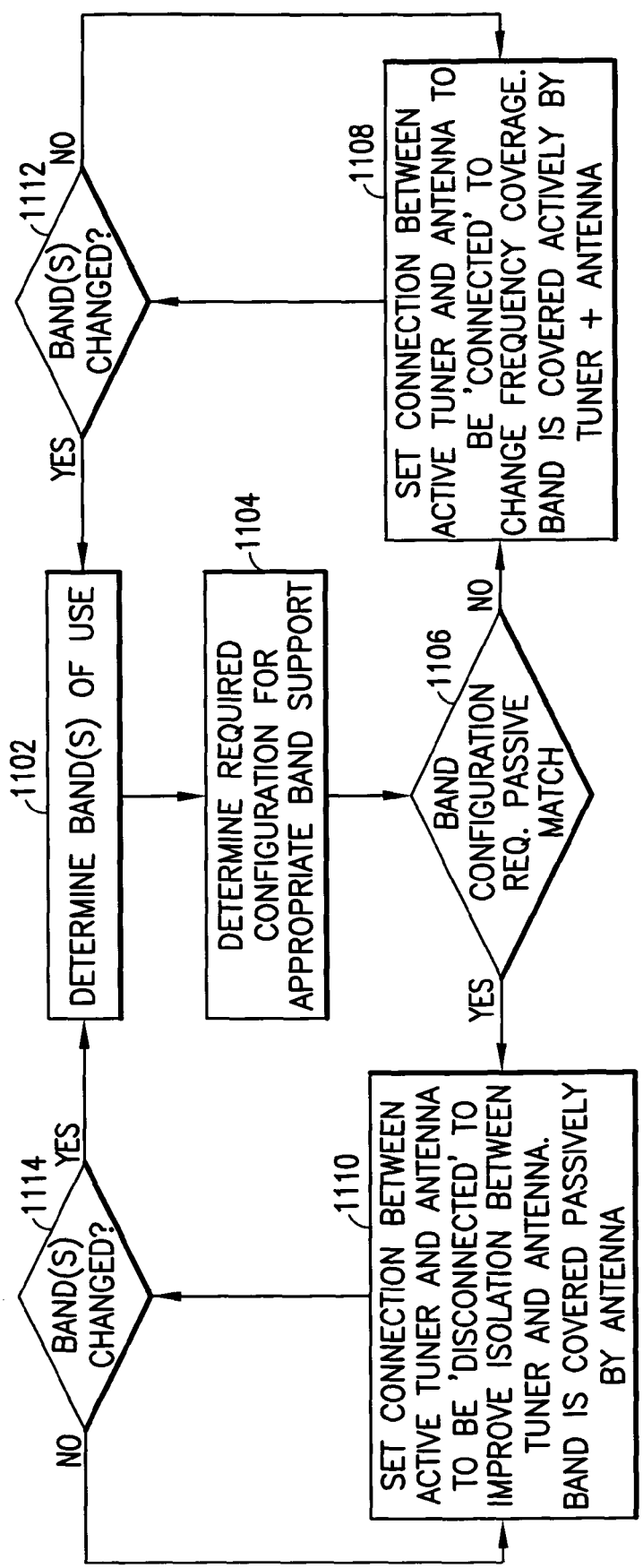

FIG. 11 illustrates a process 1100 according to embodiments of the invention, suitably carried out using an antenna arrangement comprising an active tuner that can be connected to or disconnected from an antenna, and isolated when disconnected. At block 1102, a determination is made as to the frequency bands to be used. At block 1104, a determination is made as to the required configuration for support of the frequency band being used. At block 1106, a determination is made as to whether the needed configuration requires a passive match, that is, a match to the passive frequencies covered by the antenna. If yes, the process proceeds to block 1108 and a "disconnected" configuration between the antenna and the active tuner is set, or such a configuration is maintained, so as to improve isolation between the tuner and the antenna, so that the frequency band or bands are covered passively by the antenna. If no, the process proceeds to block 1110 and a "connected" configuration between the antenna and the active tuner is set or maintained, so as to allow for active coverage by the tuner/antenna combination.

Periodically, a determination is made as to whether the frequency bands have changed. From block 1108, the process proceeds to block 1112 and a determination is made as to whether the bands in use have changed. If yes, the process returns to block 1102 and the determination of the needed configuration begins again. If no, the process returns to block 1108. From block 1110, the process proceeds to block 1114 and a determination is made as to whether the bands in use have changed. If yes, the process returns to block 1102 and the determination of the needed configuration begins again. If no, the process returns to block 1110.

While various exemplary embodiments have been described above it should be appreciated that the practice of the invention is not limited to the exemplary embodiments shown and discussed here. Various modifications and adaptations to the foregoing exemplary embodiments of this invention may become apparent to those skilled in the relevant arts in view of the foregoing description. It will be further recognized that the various blocks illustrated in FIGS. 10 and 11 and discussed above may be performed as steps, but the order in which they are presented is not limiting and they may be performed in any appropriate order with or without additional intervening blocks or steps.

Further, some of the various features of the above non-limiting embodiments may be used to advantage without the corresponding use of other described features.

The foregoing description should therefore be considered as merely illustrative of the principles, teachings and exemplary embodiments of this invention, and not in limitation thereof.

We claim:

1. An apparatus comprising:
   at least one processor;
   memory storing computer program code;
   wherein the memory storing the computer program code is configured to, with the at least one processor, cause an apparatus to at least:
   determine a frequency range to be covered by a portable communications device operating in a wireless communication network; and
   control one or more connections between an active tuner and an antenna that is passively tuned to one or more specified frequency ranges through the use of at least one permanently connected passive component, so as to select coverage of the one or more specified frequency ranges to which the antenna is passively tuned, or one or more frequency ranges that are different from the specified frequency range by the antenna in combination with the active tuner.

2. The apparatus of claim 1, wherein controlling the connection further comprises electrically isolating the tuner from the antenna.

3. The apparatus of claim 2, wherein isolating the tuner from the antenna comprises one or more of disconnecting the antenna from the tuner and connecting the tuner to a ground.

4. The apparatus of claim 3, wherein isolating the tuner from the antenna comprises removing power from the tuner.

5. The apparatus of claim 1, wherein controlling the connection comprises setting at least one connection so as to place the tuner in at least one of a series and a shunt configuration with at least one of the following:
   a transmitter and the antenna;
   a receiver and the antenna.

6. The apparatus of claim 1, wherein the apparatus is configured to connect to the portable communications device to determine the frequency range to be covered by using carrier aggregation to at least one base station, and to configure for coverage using the passively tuned frequency range of the antenna.

7. The apparatus of claim 1, wherein the apparatus is configured to connect to the portable communications device to determine the frequency range to be covered to at least one base station, wherein the connection provides for multiple communication protocols, and to configure for coverage using the passively tuned frequency range of the antenna.

8. A portable electronic device comprising the apparatus of claim 1.

9. A method comprising:
   determining a frequency range to be covered by a portable communications device operating in a wireless communication network; and
   controlling one or more connections between an active tuner and an antenna that is passively tuned to one or more specified frequency ranges through the use of at least one passive component, so as to select coverage of the one or more specified frequency ranges to which the antenna is passively tuned, or one or more frequency ranges that are different from the specified frequency range by the antenna in combination with the active tuner.

10. The method of claim 9, wherein controlling the connection further comprises isolating the tuner from the antenna.

11. The method of claim 10, wherein isolating the tuner from the antenna comprises one or more of disconnecting the antenna and connecting the tuner to a ground.

12. The method of claim 11, wherein isolating the tuner from the antenna comprise removing power from the antenna.

13. The method of claim 9, wherein controlling the connection comprises setting at least one connection so as to place the tuner in series or shunt with transmitter or receiver and the antenna.

14. The method of claim 9, wherein determining the frequency range to be covered comprises identifying a broader frequency range to be covered as compared to the passively tuned frequency range of the antenna.

15. The method of claim 9, for a portable communications device configured to connect using carrier aggregation to at least one base station, wherein the connection provides for multiple communication protocols, identifying a broader frequency range to be covered as compared to the passively tuned frequency range of the antenna.

16. A non-transitory computer readable medium storing a program of instructions, execution of which by a processor configures an apparatus to at least:
    determine a frequency range to be covered by a portable communications device operating in a wireless communication network; and
    control one or more connections between an active tuner and an antenna that is passively tuned to one or more specified frequency ranges through the use of at least one permanently connected passive component, so as to select coverage of the one or more specified frequency ranges to which the antenna is passively tuned, or one or more frequency ranges that may be different from the specified frequency range by the antenna in combination with the active tuner.

17. The computer readable medium of claim 16, wherein controlling the connection further comprises isolating the tuner from the antenna.

18. The computer readable medium of claim 17, wherein isolating the tuner from the antenna comprises one or more of disconnecting the tuner from the antenna, disconnecting the tuner from the RF front end, and connecting the tuner to a ground.

19. The computer readable medium of claim 16, wherein controlling the connection comprises setting at least one connection so as to place the tuner in series or shunt with a transmitter or receiver and the antenna.

20. The computer readable medium of claim 16, wherein determining the frequency range to be covered comprises identifying a broader frequency range to be covered as compared to the passively tuned frequency range of the antenna.

21. The computer readable medium of claim 16, wherein determining the frequency range to be covered comprises, for a portable communications device configured to connect using carrier aggregation to at least one base station, wherein the connection provides for multiple communication protocols, identifying a broader frequency range to be covered as compared to the passively tuned frequency range of the antenna.

* * * * *